United States Patent
Kim et al.

(10) Patent No.: US 12,433,001 B2
(45) Date of Patent: Sep. 30, 2025

(54) SEMICONDUCTOR DEVICE AND METHOD OF MANUFACTURE

(71) Applicant: NEXPERIA B.V., Nijmegen (NL)

(72) Inventors: Hungjin Kim, Nijmegen (NL); Phil Rutter, Nijmegen (NL)

(73) Assignee: Nexperia B.V., Nijmegen (NL)

(*) Notice: Subject to any disclaimer, the term of this patent is extended or adjusted under 35 U.S.C. 154(b) by 524 days.

(21) Appl. No.: 17/572,861

(22) Filed: Jan. 11, 2022

(65) Prior Publication Data

US 2022/0223697 A1 Jul. 14, 2022

(51) Int. Cl.
| | |
|---|---|
| *H10D 64/00* | (2025.01) |
| *H10D 30/01* | (2025.01) |
| *H10D 30/66* | (2025.01) |
| *H10D 64/01* | (2025.01) |

(52) U.S. Cl.
CPC ....... *H10D 64/117* (2025.01); *H10D 30/0297* (2025.01); *H10D 30/665* (2025.01); *H10D 30/668* (2025.01); *H10D 64/01* (2025.01)

(58) Field of Classification Search
CPC .............. H01L 29/407; H01L 29/401; H01L 29/66734; H01L 29/7811; H01L 29/7813; H01L 29/7832; H01L 29/7397; H01L 29/0634; H01L 29/7802; H01L 29/402; H01L 29/78; H10D 64/117; H10D 30/0297; H10D 30/665; H10D 30/668; H10D 64/01; H10D 30/66; H10D 12/481; H10D 30/615; H10D 62/111; H10D 64/111; H10D 30/60

See application file for complete search history.

(56) References Cited

U.S. PATENT DOCUMENTS

| | | | | |
|---|---|---|---|---|
| 5,563,760 | A * | 10/1996 | Lowis | H01L 29/7802 |
| | | | | 257/E29.259 |
| 6,750,524 | B2 * | 6/2004 | Parthasarthy | H10D 30/66 |
| | | | | 257/493 |
| 9,881,996 | B2 * | 1/2018 | Hiyoshi | H01L 21/02576 |
| 2003/0214009 | A1 | 11/2003 | Parthasarathy et al. | |
| 2007/0007537 | A1 * | 1/2007 | Ogura | H01L 29/1033 |
| | | | | 257/E29.054 |
| 2009/0152667 | A1 | 6/2009 | Rieger et al. | |
| 2013/0082322 | A1 * | 4/2013 | Weber | H01L 29/872 |
| | | | | 257/329 |
| 2015/0115333 | A1 * | 4/2015 | Bobde | H01L 29/0634 |
| | | | | 257/265 |

FOREIGN PATENT DOCUMENTS

EP  2626905 A2  8/2013

OTHER PUBLICATIONS

Extended European Search Report and Written Opinion for corresponding European application EP21150975.7, 9 pages dated Jul. 12, 2021.

* cited by examiner

*Primary Examiner* — Steven B Gauthier
*Assistant Examiner* — Khatib A Rahman
(74) *Attorney, Agent, or Firm* — Ruggiero McAllister & McMahon LLC

(57) ABSTRACT

A semiconductor device is provided, including a substrate having a first epitaxial layer arranged thereon and a voltage blocking element arranged in the first epitaxial layer, a second epitaxial layer arranged on the first epitaxial layer, and a vertical switching element arranged in the second epitaxial layer.

18 Claims, 5 Drawing Sheets

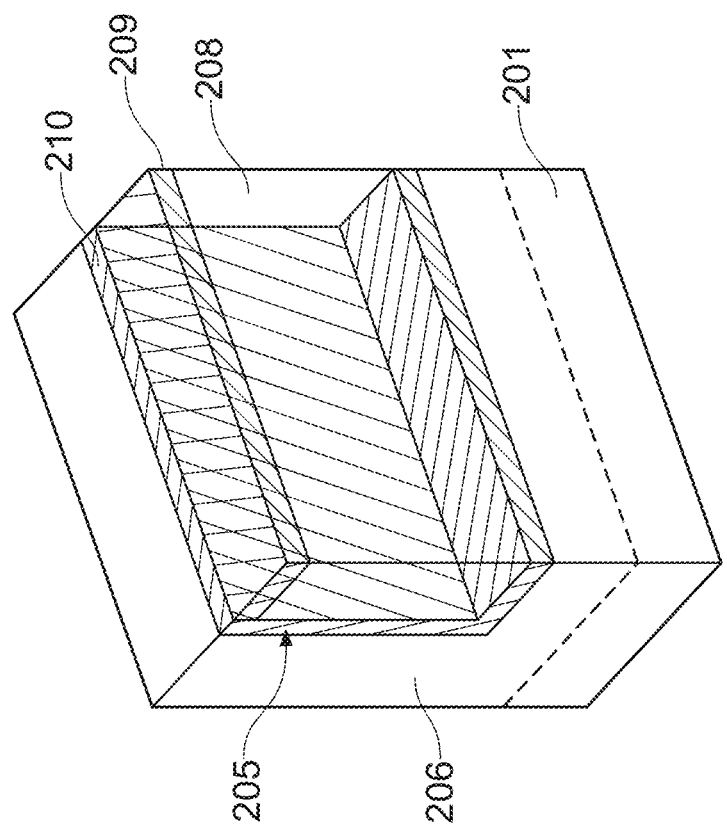
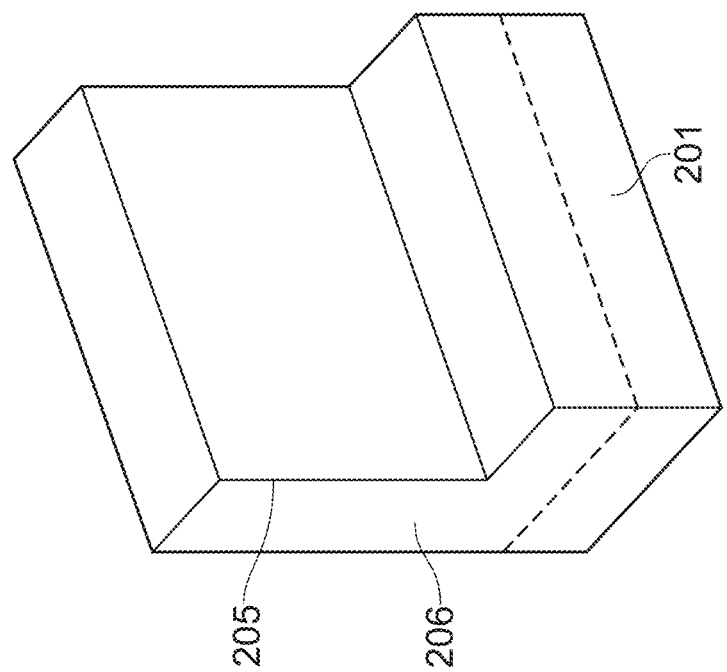
FIG. 2b
FIG. 2a

SEMICONDUCTOR DEVICE AND METHOD OF MANUFACTURE

CROSS REFERENCE TO RELATED APPLICATION

This application claims the benefit under 35 U.S.C. § 119(a) of European Application No. 21150975.7 filed Jan. 11, 2021, the contents of which are incorporated by reference herein in their entirety.

BACKGROUND OF THE DISCLOSURE

1. Field of the Disclosure

The present disclosure relates to a semiconductor device and a method of manufacture. In particular, the present disclosure relates to a power MOSFET semiconductor device comprising a field plate structure.

2. Description of the Related Art

During operation power MOSFET semiconductor devices have an inherent resistance between the drain and source terminals known as on-state drain to source resistance, or $R_{Dson}$. $R_{Dson}$ is the sum of the individual resistances of the individual layers making up the device. For example, the individual resistances may include: the source resistance $R_S$, the body resistance $R_{body}$ (also known as the channel resistance), the epitaxial layer resistance $R_{epi}$, the drain resistance $R_D$, etc. The epitaxial layer resistance $R_{epi}$, is the main contributory factor to the $R_{Dson}$ of a device as a required blocking voltage increases.

The breakdown voltage (BV) of a MOSFET is the reverse voltage that can be applied across the source and drain without causing an exponential increase in the leakage current in the device. In power MOSFET semiconductor devices the BV rating is a function of the doping concentration, doping profile and thickness of the epitaxial layer.

For MOSFET semiconductor devices the following main aspects determine the BV and the $R_{Dson}$ of the device: channel length/density(width), the doping level/profile and the thickness of the epitaxial layer. The thicker the epitaxial layer and the lower the doping level, the higher the BV. Likewise, the thinner the epitaxial layer, the shorter/denser channel, and the higher the doping level, cause the lower the $R_{Dson}$.

To increase the BV of a power MOSFET semiconductor device it is therefore possible to increase the thickness of the epitaxial layer. However, as is apparent from the above discussion, this has the disadvantage that it will cause an increase in the device $R_{Dson}$. It can be seen therefore that there is an inherent trade-off between BV and $R_{Dson}$.

In many applications, as the requirement for lower $R_{Dson}$ at given a drain-source voltage (Vds) ratings increases, various device structures have been introduced to reduce $R_{Dson}$ at given Vds, or breakdown voltage. So-called super-junction devices may employ thinner epitaxial layers for a given breakdown voltage by the inclusion of a so-called p-pillar in the epitaxial layer. However, multi-epitaxial layering which requires long and high temperature to grow pure single crystal structure has confronted the limitation of the design rule shrinkage in pillar to pillar from the misalignment and boron diffusion implanted for p-pillars although certain optimisations in the structural layers have been achieved and it is still beneficial in the area where physical process like deep trench etching and electrode filling process are challengeable. Another structural embodiment has been introduced and implemented, called trench MOSFET with shield electrode formed either by a vertically split or by a laterally split from gate replacing implant pillar and taking similar role. The length of the channel is subject to a vertical shrinkage of the device which is normally achieved through epitaxial layer engineering and related processes to charge balance, Vds drop, like cell pitch, trench depth, liner oxide thickness, etc. The density of channel is normally subject to the density and design rule of p-pillars or shield electrodes and therefore very limited and hard to increase or decrease. Such an optimisation, like shortening channel length, may requires a new process and for a series of devices having different voltage nodes this can be expensive in terms of design and development but also requires multiple fab process for each node.

Nowadays, power MOSFET semiconductor devices include a shield electrode, or a field plate, as previously said and formed in the epitaxial layer to improve depletion in the active area of the device, called charge balance, and epitaxial layer with graded profile to reduce high peak of electric field. The shield electrode takes a role to maximize a re-surf effect, which gives much more effective electric field reduction with less $R_{Dson}$ increase and trade-off to BV. The narrower the mesa between shield electrodes, or field plates, the lower the $R_{Dson}$ is achievable because the narrower mesa allows to increase doping concentration and the epitaxial layer resistance by increasing doping concentration decreases more drastically than the decrease in reducing mesa width. In other words, narrowing mesa width is one of the most effective ways to achieve a low $R_{Dson}$. On the other hand, reduced mesa width increases gate charges because the density of channel under gate electrode is normally determined by the density of trench, which is given by cell pitch, i.e. trench plus mesa. As a result, an increased gate charge degrades dynamic performance, and therefore there is a trade-off between $R_{Dson}$ and gate charge.

Thus, the best performing power MOSFET is with lower $R_{Dson}$, higher BV and lower gate charge and more cost-effective accommodation for various blocking voltages is critical and being pursued in the industry.

SUMMARY

Various example embodiments are directed to the disadvantage as described above and/or others which may become apparent from the following disclosure.

According to an embodiment of this disclosure a semiconductor device compromises a substrate having a first epitaxial layer arranged thereon and a voltage blocking element arranged in the first epitaxial layer. The voltage blocking element can be an electric field plate structure or a shield electrode. The semiconductor device further comprises a second epitaxial layer arranged on the first epitaxial layer, and a vertical switching element arranged within the second epitaxial layer. The vertical switching element can be a VDMOS, a trench MOSFET, a power MOSFET, an insulated gate bipolar transistor, a bipolar transistor, a JFET device, a MESFET device, a thyristor, a diode, or a suitable voltage blocking pseudo-vertical devices.

According to an embodiment of this disclosure the voltage blocking element is connected to a source of the vertical switching element.

According to an embodiment of this disclosure the voltage blocking element is connected to a potential other than source, between the source and drain, of the vertical switching element.

The disclosure also relates to an automotive part comprising a semiconductor device as specified above and to a method of forming a semiconductor device as specified above.

According to an embodiment of this disclosure a method of manufacturing a semiconductor device comprises following steps:
- providing a semiconductor substrate and forming a first epitaxial thereon;
- forming a voltage blocking element in the first epitaxial layer, such as an electric field plate structure or a shield electrode or similar;
- forming a second epitaxial layer on the first epitaxial layer;
- forming a vertical switching element on the second epitaxial layer, such as a VDMOS, a trench MOSFET, a power MOSFET, an insulated gate bipolar transistor, a bipolar transistor, a JFET device, a MESFET device, a thyristor, a diode, or a suitable voltage blocking pseudo-vertical devices.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIGS. 2a to 2b illustrates a semiconductor substrate having an epitaxial semiconductor layer formed thereon.

DETAILED DESCRIPTION

Figure 1:
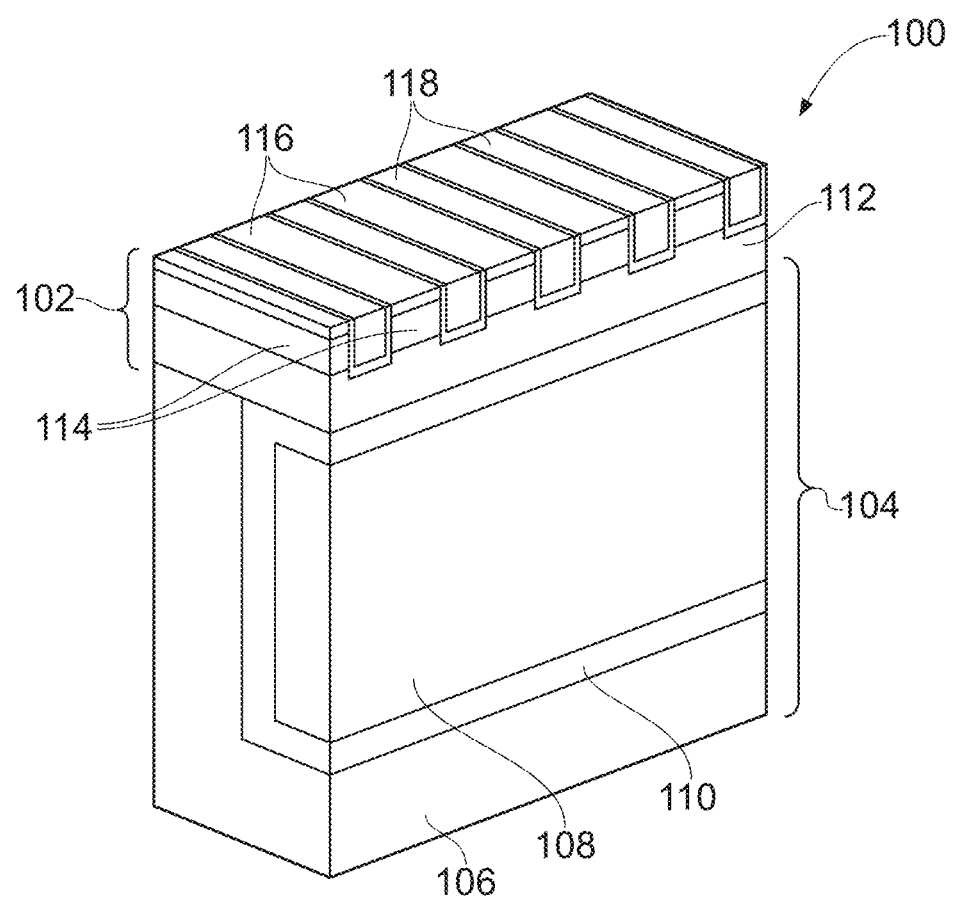
FIG. 1 illustrates a semiconductor device according to an embodiment of the disclosure.

The structure of a semiconductor device 100 according to an embodiment of the disclosure is illustrated in FIG. 1. The semiconductor device 100 structure comprises two distinct, but interoperable elements, namely a power MOSFET element 102 arranged on an electric field plate element 104.

The electric field plate element 104 comprises a first epitaxial layer 106 formed on a semiconductor substrate, which semiconductor substrate is not shown in FIG. 1. The semiconductor substrate can be a heavily doped substrate, i.e. having a very high doping concentration. It is typically formed of the same type of dopants as the first epitaxial layer 106. A shield electrode 108 is arranged in a trench formed in the first epitaxial layer 106. The shield electrode 108 is electrically isolated from the first epitaxial layer 106 by a suitable shield electrode oxide layer 110. Formed dielectric film on the shield electrode 108 separates the shield electrode from the power MOSFET element formed on a second epitaxial layer 112. The shield electrode 108 may be formed of any appropriate material such as metal or a deposited silicon that is doped. The first epitaxial layer 106 is grown at a chosen doping level, either a single or multi-layer for a graded doping profile, on the heavily doped silicon substrate. The shield electrode oxide layer 110 is formed either by thermal oxidation, or by thermal oxidation and deposited oxide, e.g. low pressure chemical vapor deposition (LPCVD), in the trench formed by lithography and etching, wherein a resist is masked, or a hard film is masked. The deposited oxide may be densified by annealing at a high temperature, e.g. 1100 degree Celsius. Then, the shield electrode 108 is formed by deposition of silicon, which can be doped, or other appropriate material like refractory metal which is stable at high temperature and planarized either by a chemical mechanical planarization (CMP) with stopping dielectric film and/or a dry etch, which can be a plasma-based, chemical dry etch. Lastly in shield electrode oxide layer, a dielectric film is provided so to separate the shield electrode 108 from power MOSFET element 102. The dielectric film is formed in the second epitaxial layer 112 by oxidation and/or deposition of the dielectric film and CMP with stopping layer. The process steps for the formation of the electric field plate element 104 will be discussed in more detail below.

The power MOSFET element 102 comprises the second epitaxial layer 112, arranged on the complete electric field plate element 104. In the example embodiment of FIG. 1, the power MOSFET element 102 is a trench based MOSFET, however this could be another split gate type trench MOSFET, any structure like thick TBO-based trench MOSFET or Hexagon, a VDMOS, or other power MOSFET, insulated gate bipolar transistor, a bipolar transistor, a JFET device, a MESFET device, a thyristor, a diode, even suitable voltage blocking pseudo-vertical devices, or the like. In this example the trench based MOSFET comprises body regions 114, which are also known as channel regions, which body regions 114 are arranged in or on the second epitaxial layer 112, which is accordingly doped with same type of dopants. Source regions 116 are arranged on the body regions 114 to provide the source terminal of the semiconductor device 100. Gate electrodes 118 are formed in the trenches. The gate trenches may extend through and terminate in the second epitaxial layer 112. The drain region of the power MOSFET element 102 is formed by the connection of the second epitaxial layer 112 to the first epitaxial layer 106. A drain connection, which is not shown in FIG. 1, may be formed on a bottom surface of the semiconductor substrate, which is also not shown in FIG. 1.

In the example MOSFET structure 102, a super-junction structure with implanted pillars by opposite type of dopants formed through contact may be established for further electric field reduction to accommodate a certain drain voltage drop.

The semiconductor substrate, the first epitaxial layer 106 and second epitaxial layer 112, making up the drain and drift region of the semiconductor device, may be formed of a first conductivity type. By way of example, the semiconductor substrate may be n-type. The body regions 114 may be formed of a second conductivity type, opposite to the first conductivity type, such that the body regions 114 may be of p-type. The source regions 116 may be formed of the first conductivity type. In this way the drain region and the source regions 116 of the semiconductor device 100 will be of n-type, whereas the body regions 114 will be of p-type. However, the skilled person will appreciate that the conductivity type of the regions may be juxtaposed such that the drain region and the source regions 116 may be of p-type and the body regions 114 may be of n-type. The skilled person will appreciate that the power MOSFET structure 102 described above is a reduced surface field (RESURF) type device.

The foregoing arrangement of electric field plate element 104 enhances depletion in the body regions 114 so to secure an optimum charge balance at given design, process and/or substrate condition. It is an optimum depletion to achieve maximum BVdss. Charge balance is achieved between under-depletion and over-depletion and thus the maximized breakdown voltage at a Rdson can be achieved through well designing the MOSFET structure, process and substrate condition and allows the tuning of the wanted drain voltage drop by modulating design/process/substrate, for example a trench CD and depth, mesa width, liner oxide thickness, etc., at a selected substrate condition.

The second epitaxial layer 112 is epitaxial lateral overgrowth. The second epitaxial layer growth starts on mesa (silicon exposed) in the epitaxial layer. The first epitaxial layer and the second epitaxial layer work as a voltage divider. For example, in case of a 100V node, the division could be 60V-40V, 70V-30V, 50V-50V, etc. It means that the Vds drop in first epitaxial layer can be 60V, 70V or 50V, which makes easy in process because trench depth does not need to be deep like 100V device and therefore lithography also becomes easier, since the PR are thinner, narrower mesa, usually with a higher doping concentration in the epitaxial layer. It also allows a lower resistance and better resurf.

In the second epitaxial layer, any MOSFET, with a different channel density and structures, can be formed in necessity regardless of the field plate which allows higher channel density with additional resurf structure, for the rest Vds drop like 40V, 30V, 50V or similar. It allows freely to modify the doping concentration and the MOSFET structure. As a result, much lower Rdson can be achieved.

The thickness of the shield plates of the first epitaxial layer doped accordingly gives a rise to a first amount of Vds reduction and the thickness of the device structures of the second epitaxial layer gives a rise to a second or the rest amount of Vds reduction. If, for example, a 100V device was selected, the sum of the two Vds reductions should be over 100V.

Figure 3:
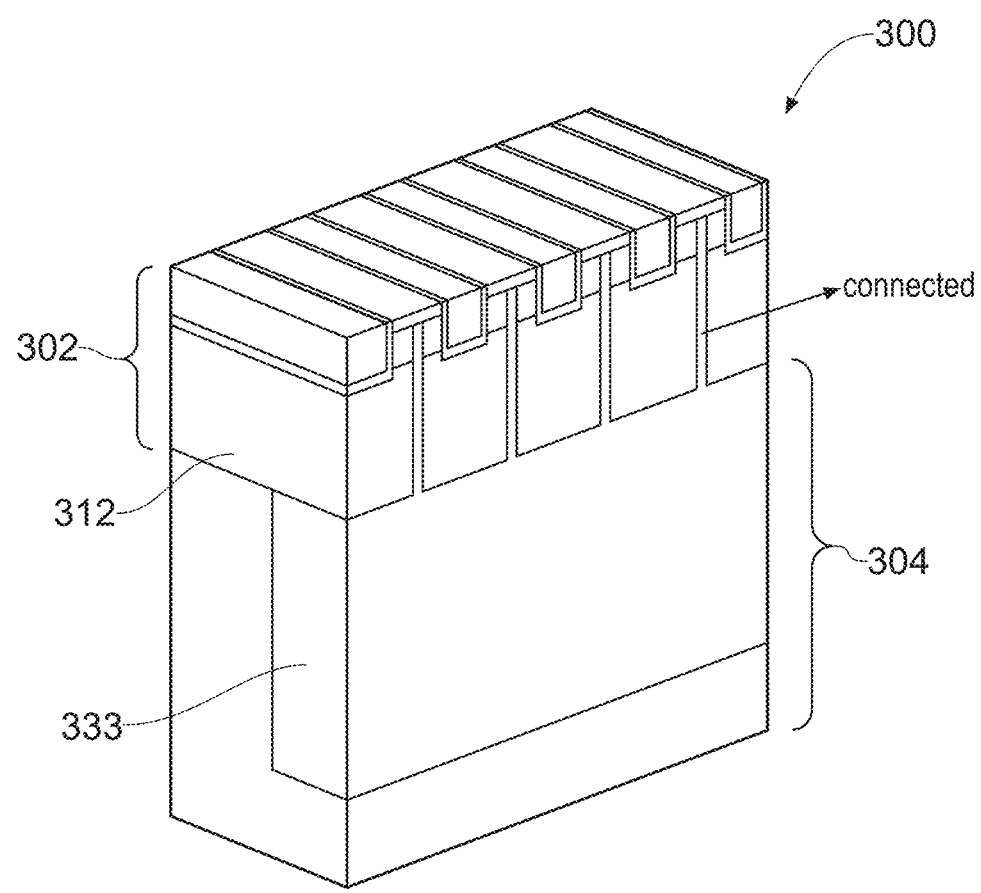
FIG. 3 illustrates a further semiconductor device according to an embodiment of the disclosure.
Figure 4:
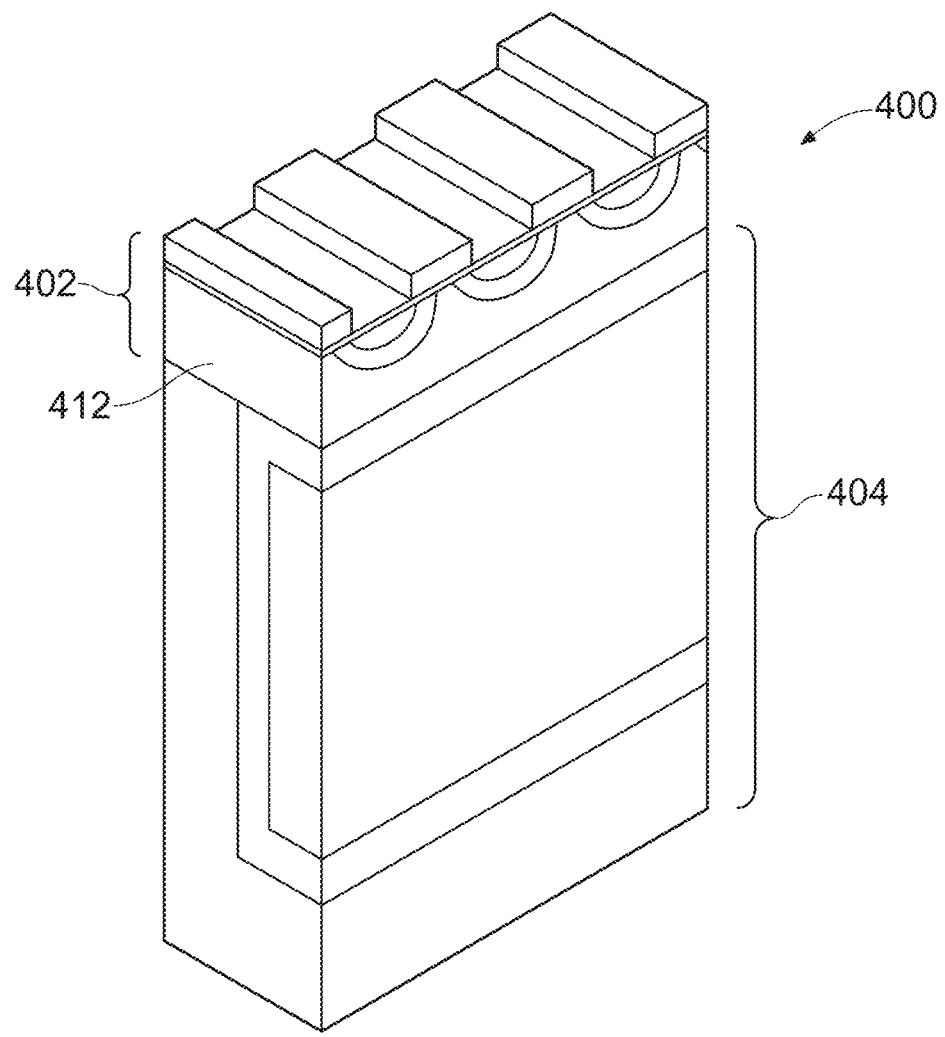
FIG. 4 illustrates a further semiconductor device according to an embodiment of the disclosure.

Whilst the power MOSFET structure 102 structure is a trench based structure, the skilled person will see, as illustrated by the following example embodiments in FIGS. 3 and 4, that the present disclosure is not so limited, and may comprise a trench MOSFET with RESURF pillars, VDMOS or any suitable MOSFET structure arranged on the field plate structure.

In this way, the skilled person will see that it is possible to form any MOSFET structure having pitch and channel widths which for a given device area, on the field plate structure which is independent of the dimensions of the shield electrode.

FIGS. 2*a* and 2*b* illustrate an example process flow for forming a semiconductor device according to an embodiment of the disclosure.

In general terms the process comprises two distinct aspects, namely: formation of the electric field plate structure; followed by the formation of the power MOSFET structure on the electric field plate structure.

Formation of the filed plate structure begins in FIG. 2*a* in which a substrate 201 is provided with a first epitaxial layer 206 formed thereon. Preferably the substrate is formed of a semiconductor material, for example a silicon. The first epitaxial layer 206 may be, for example, a crystalline structure and may be formed by any appropriate epitaxial process. The first epitaxial layer 206 and the substrate 201 may be formed of semiconductor materials of first conductivity type.

An opening such as a trench 205, is formed in the first epitaxial layer 206 by any appropriate process, for example etching the first epitaxial layer 206. The trench 205 extends into an terminates in the first epitaxial layer 206. In other words, the trench terminates in the first epitaxial layer 206 and does not extend into the substrate 201. The width of the opening of the trench 205 may be defined using a hard mask and the depth of the opening in the first epitaxial layer 206 may be removed by any appropriate etch, such as a reactive ion etch for example. The skilled person will appreciate that any appropriate etch process may be employed to define the geometry of the trench 205.

As illustrated in FIG. 2*b* a shield electrode oxide layer 210 is formed on the sidewalls and the base of the trench 205. The shield electrode oxide layer 210 may be formed by any appropriate process as understood by those skilled in the art. For example, the side walls and base of the trench 205 may undergo a pre-treatment cleaning dry etch, or a sacrificial oxidation followed by a wet etch of the sacrificial oxidation. Following pre-treatment, the side walls and the base of the trench 205 may undergo thermal oxidation to form a first dielectric. A second dielectric may then be formed on the first dielectric by a CVD process, which is then followed by a densification process. Collectively the first and second dielectric layers form the shield electrode oxide layer 210 lining the side walls and base of the trench 205.

Following formation of the shield electrode oxide layer 210 on the side walls and base of the trench 205, the shield electrode 208 is formed in the trench 205. The shield electrode 208 may be formed by any appropriate process as understood by those skilled in the art. For example, the shield electrode 208 material may be deposited in the oxide lined trench 205 by deposition of doped silicon material or similar material such as polycide (e.g. WSix), refractory metals (TiN, W, TiW, TaN) etc. Following the deposition, the shield electrode 208 material is planarised to align with the top of the trench 205 by a dry etch process or a combination of chemical mechanical polishing (CMP) and dry etch. The shield electrode 208 material may be cleaned following planarization. A further oxide layer 209 may then be formed on top of the shield electrode 208 material to electrically isolate the shield electrode 208 from subsequent materials formed thereon. The further oxide layer 209 may then undergo a dry etch or CMP and wet etch to expose to remove any further oxide layer 209 formed on the first epitaxial layer 206. This ensures that no further oxide layer 209 interrupts the conduction path to the first epitaxial layer 206.

The field plate may be formed by implantation in the semiconductor layer. For example, by a sacrificial oxidation (50 nm below), a litho, multi implants (MeV->KeV) or a PR strip, an anneal, a rapid thermal anneal or furnace. Such an implanted pillar structure is beneficial in the MOSFET structure with an implanted pillar (so called SJ-MOSFET) because first and second implanted pillars are connected electrically. The foregoing process flow thus defines the electric field plate structure. Following formation of the electric field plate structure the power MOSFET structure architecture may then be formed on the electric field plate structure as discussed below.

In an embodiment of this disclosure a power MOSFET structure process begins with formation of the second epitaxial layer which may comprise native oxide removal from the further oxide layer formed on the top of the shield electrode. The second epitaxial layer may then be formed by an epitaxial growth. This is then followed by a planarization process and surface curing by an anneal step and/or sacrificial oxide which can be used as a hard mask.

The second epitaxial layer may be formed of for example intrinsic silicon and form wanted doping profile in process through Implant and diffusion process. Alternatively, the second epitaxial layer may be doped silicon or layers of multi-doped silicon, the choice of which will depend on the choice of the power MOSFET structure and designer's choice to be formed on the second epitaxial layer. Similarly, the first epitaxial layer can be also formed with single or multi-doping levels in the growth. The thickness and doping profile of the first epitaxial layer and the second epitaxial layer have to be carefully designed combined with the field plate structure in the first epitaxial layer and the device structure in the second epitaxial layer in order to avoid high peak of electric field which can reduced device robustness and breakdown.

Forming the electric field plate structure in this way effectively decouples the process for forming the power MOSFET structure from the field plate structure such that any appropriate MOSFET structure may be formed on the field plate structure.

FIGS. 3 to 4 illustrate various example power MOSFET structures that may be achieved according to embodiments.

FIG. 3 illustrates an alternative structure of a power semiconductor device 300 according to embodiments. Compared to the arrangement of FIG. 1, the power MOSFET structure 302 comprises pillars 333 arrangement extending from source regions 316 into the second epitaxial layer 312. The pillars 333 act to further improve the RESURF effect in the device. The pillar regions may extend into the second epitaxial layer to a depth deeper than the gate trenches forming the gate regions 318.

As with the arrangement described above with respect to FIG. 1, the structure of a power semiconductor device 300 in FIG. 3 comprises a power MOSFET structure 302 formed on a second epitaxial layer 312. Likewise, the second epitaxial layer 312 is formed on an electric field plate structure 304. The electric field plate structure 304 may be an implanted field plate structure or a field plate structure formed in a trench as described above.

Alternatively, and as shown in FIG. 4, the structure of a power semiconductor device 400 may comprise a Vertical Diffused MOS (VDMOS) structure forming a power MOSFET structure 402 arranged on an electric field plate structure 404. As with the arrangements described above, the VDMOS structure of the power MOSFET structure 402 is formed on the second epitaxial layer 412. Likewise, the second epitaxial layer 412 is formed on an electric field plate structure 404. The electric field plate structure 404 may be an implanted field plate structure or a field plate structure formed in a trench as described above with respect to FIGS. 1, 2a and 2b.

In view of the above discussion, the skilled person will see that the power semiconductor device and methods of manufacturing according to embodiments provide for power semiconductor devices in which it is possible to increase the breakdown voltage thereof without increasing the $R_{Dson}$.

Figure 5:
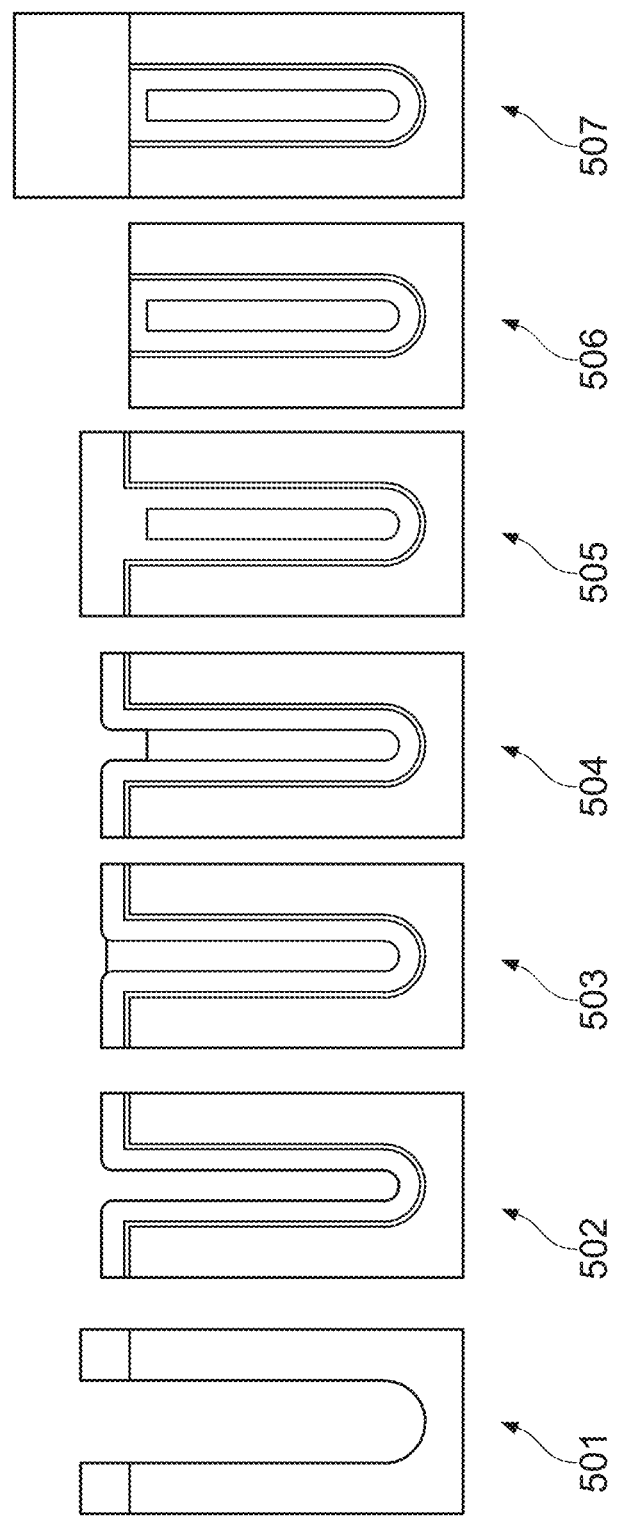
FIG. 5 illustrates a method of producing a semiconductor device according to an embodiment of the disclosure.

An embodiment of this disclosure is shown in FIG. 5, where the creation of a semiconductor device is shown. The embodiment comprises following steps:

forming trench step 501, wherein a trench is patterned by a lithography and an etch, followed by wet etching and cleaning;

forming a dielectric of a field plate step 502, which includes a thermal oxidation, and/or conformal oxide deposition by CVD, and densification;

forming an electrode of the field plate step 503 and 504
  wherein a conductive material is deposed, e.g. a doped silicon, followed by a planarization (e.g. CMP),
  as shown as 503 in FIG. 5,
  wherein a second conductive material is deposited, e.g. a doped silicon, with a pre-cleaning, wherein a dielectric film (e.g. nitride) is deposited, followed by a second epitaxial layer planarization,
  wherein a second conductive material is patterned by a lithography and an etch,
  followed by a PR strip and cleaning,
  as shown as 504 in FIG. 5;

a surface planarization and a preparation for a second epitaxial layer steps 505 and 506
  wherein a dielectric (e.g. an oxide) is deposited so to fill on the recessed electrode,
  as shown as 505 in FIG. 5;
  wherein the dielectric is recessed, while the dielectric remains at the sidewall of the patterned second electrode electrically separating the second epitaxial layer after recess,
  wherein a damaged silicon is cured with growing a thin oxide (e.g. below 100A on epitaxial later),
  followed by a removal of the thin oxide by a wet etch,
  followed by a silicon exposure for a second epitaxial layer growth,
  as shown as 506 in FIG. 5;

forming a second epitaxial layer step 507, comprising a pre-treatment and a second epitaxial layer growth, followed by a planarization (CMP) which stops at the dielectric on the second conductive material, followed by a surface treatment for a defect removal, followed by a Argon or Nitrogen anneal or a sactrifical oxidation; and forming a MOSFET or any other element as mentioned in the previous embodiments on the second epitaxial layer.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality.

Reference signs in the claims shall not be construed as limiting the scope of the claims.

What is claimed is:

1. A semiconductor device comprising:
   a substrate having a first epitaxial layer of a first conductivity type arranged thereon and a voltage blocking element arranged in the first epitaxial layer, wherein the voltage blocking element is an electric field plate structure or a shield electrode;
   a second epitaxial layer of the first conductivity type arranged on the first epitaxial layer;
   a vertical switching element arranged in the second epitaxial layer, and
   a dielectric film formed on the voltage blocking element, wherein the dielectric film electrically isolates the voltage blocking element from the vertical switching element.

2. The semiconductor device as claimed in claim 1, wherein the voltage blocking element is connected to a source of the vertical switching element.

3. The semiconductor device as claimed in claim 2, wherein the voltage blocking element is the shield electrode.

4. The semiconductor device as claimed in claim 2, wherein the voltage blocking element is the electric field plate structure.

5. The semiconductor device as claimed in claim 2, wherein the vertical switching element is an element selected from the group consisting of a VDMOS, a trench MOSFET, a power MOSFET, an insulated gate bipolar transistor, a bipolar transistor, a JFET device, a MESFET device, a thyristor, a diode, and a voltage blocking pseudo-vertical device.

6. The semiconductor device as claimed in claim 1, wherein the voltage blocking element is connected to a potential other than a source, between the source and a drain, of the vertical switching element.

7. The semiconductor device as claimed in claim 6, wherein the vertical switching element is an element selected from the group consisting of a VDMOS, a trench MOSFET, a power MOSFET, an insulated gate bipolar transistor, a bipolar transistor, a JFET device, a MESFET device, a thyristor, a diode, and a voltage blocking pseudo-vertical device.

8. The semiconductor device as claimed in claim 6, wherein the voltage blocking element is the electric field plate structure.

9. The semiconductor device as claimed in claim 6, wherein the voltage blocking element is the shield electrode.

10. The semiconductor device as claimed in claim 1, wherein the voltage blocking element is the electric field plate structure.

11. The semiconductor device as claimed in claim 10, wherein the vertical switching element is an element selected from the group consisting of a VDMOS, a trench MOSFET, a power MOSFET, an insulated gate bipolar transistor, a bipolar transistor, a JFET device, a MESFET device, a thyristor, a diode, and a voltage blocking pseudo-vertical device.

12. The semiconductor device as claimed in claim 1, wherein the vertical switching element is an element selected from the group consisting of a VDMOS, a trench MOSFET, a power MOSFET, an insulated gate bipolar transistor, a bipolar transistor, a JFET device, a MESFET device, a thyristor, a diode, and a voltage blocking pseudo-vertical device.

13. An automotive part comprising the semiconductor device as claimed in claim 1.

14. A method of forming the semiconductor device as claimed in claim 1.

15. The semiconductor device as claimed in claim 1, wherein the voltage blocking element is the shield electrode.

16. A method of manufacturing a semiconductor device, the method comprising the steps of:
   providing a semiconductor substrate and forming a first epitaxial layer of a first conductivity type thereon;
   forming a voltage blocking element in the first epitaxial layer, wherein the voltage blocking element is an electric field plate structure or a shield electrode;
   forming a dielectric fim on the voltage blocking element;
   forming a second epitaxial layer of the first conductivity type on the first epitaxial layer; and
   forming a vertical switching element on the second epitaxial layer,
   wherein the dielectric film electrically isolates the voltage blocking element from the vertical switching element.

17. The method of manufacturing a semiconductor device as claimed in claim 16, wherein the voltage blocking element is the electric field plate structure, and wherein the vertical switching element is an element selected from the group consisting of a VDMOS, a trench MOSFET, a power MOSFET, an insulated gate bipolar transistor, a bipolar transistor, a JFET device, a MESFET device, a thyristor, a diode, and a voltage blocking pseudo-vertical device.

18. The method of manufacturing a semiconductor device as claimed in claim 16, wherein the voltage blocking element is the shield electrode and wherein the vertical switching element is an element selected from the group consisting of a VDMOS, a trench MOSFET, a power MOSFET, an insulated gate bipolar transistor, a bipolar transistor, a JFET device, a MESFET device, a thyristor, a diode, and a voltage blocking pseudo-vertical device.

* * * * *